United States Patent
Bonfiglio et al.

(10) Patent No.: US 7,445,954 B2
(45) Date of Patent: Nov. 4, 2008

(54) METHOD OF FABRICATING SUBSTRATELESS THIN FILM FIELD-EFFECT DEVICES AND AN ORGANIC THIN FILM TRANSISTOR OBTAINABLE BY THE METHOD

(75) Inventors: Annalisa Bonfiglio, Cagliari (IT); Ornella Sanna, deceased, late of Cagliari (IT); by Sergio Sanna, legal representative, Guspini (IT); by Giulia Lampis, legal representative, Guspini (IT); by Marco Federico Sanna, legal representative, Guspini (IT); by Giulia Sanna, legal representative, Villorba (IT); Fulvia Mameli, Cagliari (IT)

(73) Assignee: Consiglio Nazionale Delle Ricerche-INFM Istituto Nazion, Genoa (IT)

(*) Notice: Subject to any disclaimer, the term of this patent is extended or adjusted under 35 U.S.C. 154(b) by 146 days.

(21) Appl. No.: 10/547,361
(22) PCT Filed: Feb. 27, 2004
(86) PCT No.: PCT/IB2004/000592
§ 371 (c)(1), (2), (4) Date: Aug. 29, 2005
(87) PCT Pub. No.: WO2004/077500
PCT Pub. Date: Sep. 10, 2004

(65) Prior Publication Data
US 2006/0263953 A1 Nov. 23, 2006

(30) Foreign Application Priority Data
Feb. 28, 2003 (IT) .......................... TO2003A0145

(51) Int. Cl.
H01L 51/40 (2006.01)
(52) U.S. Cl. .......................... 438/99; 438/151; 257/40; 257/E51.006
(58) Field of Classification Search .................. 438/99, 438/142, 151, 158, 160, 161; 257/40
See application file for complete search history.

(56) References Cited

U.S. PATENT DOCUMENTS
6,197,663 B1  3/2001 Raju et al.
(Continued)

FOREIGN PATENT DOCUMENTS
EP  1 256 983 A  11/2002
WO  WO 03/026034 A  3/2003

OTHER PUBLICATIONS

J. Ficker, et al.: "Dynamic and Lifetime Measurements of Polymer Ofets and Integrated Plastic Circuits" Proceedings of the SPIE, SPIE, Bellingham, VA, US, vol. 4466, 2001, pp. 95-102, XP001197302, ISSN: 0277-786X.
(Continued)

Primary Examiner—Charles D. Garber
Assistant Examiner—Reema Patel
(74) Attorney, Agent, or Firm—Sughrue Mion, PLLC (57) ABSTRACT

A method for the manufacture of a thin-film field-effect device comprising, on a mechanical support layer, source and drain electrodes (S, D), a layer of semiconductor material (SC) for the formation of a conduction channel, and a gate electrode (G) insulated from the channel region, is described. The method provides for the use of a mechanical support layer in the form of a film (INS) of flexible, electrically insulating material; for the formation of the source and drain electrodes (S, D) in accordance with a predetermined configuration on a first surface of the insulating film; and for the formation of the gate electrode (G) on the opposite surface of the insulating film (INS) in accordance with a predetermined configuration complementary with the configuration of the source and drain electrodes (S, D), that configuration being achieved by a lithographic technique by selective masking determined by the source and drain electrodes (S, D) which are formed on the first surface of the film (INS).

13 Claims, 6 Drawing Sheets

U.S. PATENT DOCUMENTS

| | | |
|---|---|---|
| 6,326,640 B1 | 12/2001 | Shi et al. |
| 6,605,494 B1 * | 8/2003 | Park et al. .................. 438/149 |
| 6,697,131 B2 * | 2/2004 | Takami et al. ................ 349/74 |
| 7,084,507 B2 * | 8/2006 | Awano ...................... 257/773 |

OTHER PUBLICATIONS

H. Kavak et al.: "Thin Film Transistors on Polymide Substrates" Journal of Non-Crystalline Solids, North-Holland Publishing Company, Amsterdam, NL, vol. 266-269, May 2000, pp. 1325-1328, XP004198753, ISSN: 0022-3093.

P. Dyreklev, et al.: Polymeric Field Effect Transistors Using Oriented Polymers: Synthetic Metals, Elsevier Sequoia, Lausanne, CH, vol. 57, No. 1, Apr. 12, 1993, pp. 4093-4098, XP000961709, ISSN: 0379-6779.

Francis Garner. et al. "All-Polymer Field-Effect Transistor Realized by Printing Techniques". Science Reports. vol. 265. Sep. 16, 1994; pp. 1684-1686.

* cited by examiner

METHOD OF FABRICATING SUBSTRATELESS THIN FILM FIELD-EFFECT DEVICES AND AN ORGANIC THIN FILM TRANSISTOR OBTAINABLE BY THE METHOD

BACKGROUND OF THE INVENTION

The present invention relates in general to planar techniques for the manufacture of semiconductor devices and in particular to a method for the manufacture of substrateless thin-film field-effect devices such as, for example, organic thin-film transistors.

Organic-based transistors have been the subject of investigation for less than twenty years and their development is currently having a decisive boost. These devices are basically field-effect devices which are based on a design known as thin-film transistor (TFT), which was initially devised for devices made of amorphous silicon.

Figures 1A, 1B, 1C, 2:
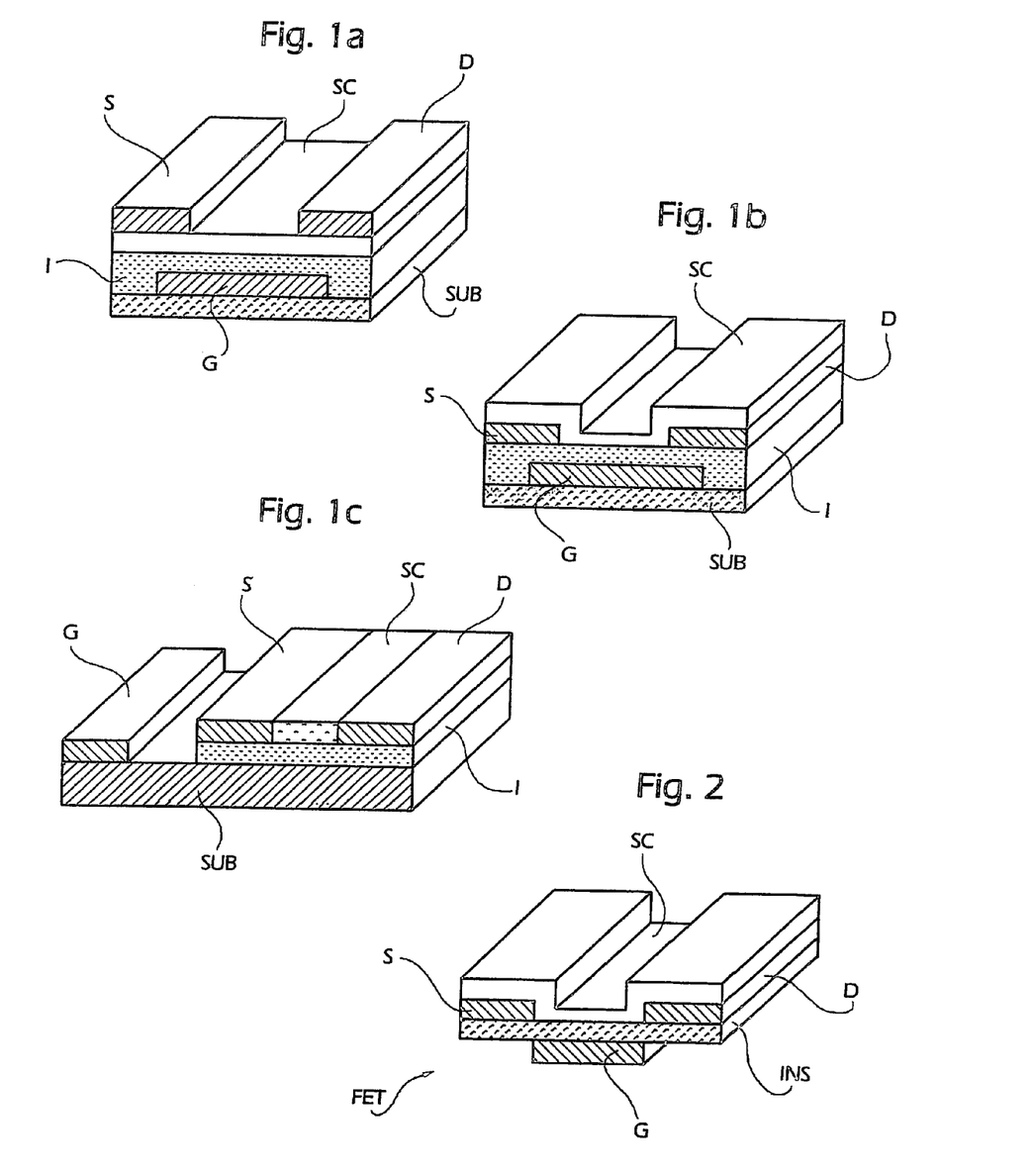
FIGS. 1a, 1b and 1c show, by way of example, three designs of the structure of thin-film field-effect devices according to the prior art, which are discussed in the introductory part of this description.
FIG. 2 shows, by way of example the device produced by the method of the invention.

Up to now, devices having one of the two structures shown in FIGS. 1a and 1b and known as the "top-contact" type and the "bottom-contact" type, respectively, have been produced with vertical geometry on the basis of this design.

In the first example of the prior art illustrated, the structure is formed on the basis of a rigid substrate SUB on which the gate contact G, the insulating layer I, the organic semiconductor layer SC and, finally, the source and drain contacts S and D are formed in succession.

In the second example, the structure is again formed on the basis of a rigid substrate SUB and the gate contact G, the insulating layer I, the source and drain contacts S and D and, lastly, the organic semiconductor layer SC are formed thereon in succession.

The device is defined as "organic" because the semiconductor in which the conduction channel is formed, in which channel the flow of current takes place between the source and drain, is made of an organic material (generally a polymer) rather than of silicon or other inorganic compounds. This structure can—in principle—be produced on flexible substrates (for example, on plastics) and this gives access to a wide range of applications which require flexibility and are incompatible with technology based on silicon or on other semiconductors having characteristics of mechanical rigidity.

In contrast with silicon-based technology, the development of which is directed towards satisfying requirements for a very high degree of miniaturization and high speed, the technology of the development of organic semiconductors satisfies the opposite requirements of applications on large areas and/or for which a slow switching speed is adequate.

A structural design of a device with horizontal geometry is shown in FIG. 1c. The substrate SUB is made of highly doped silicon and the gate contact G and the insulating layer I, generally silicon oxide, are formed side by side thereon so as to produce the gate in an outer region relative to the channel and to be able to contact it easily. The source and drain contacts S and D are formed on the insulating layer. The organic semiconductor SC is deposited between the source and drain contacts. The highly doped substrate behaves as a metallization to form the gate contact and the insulating oxide layer permits capacitive coupling of the gate contact with the channel region which is formed in the semiconductor.

As an alternative to these types of rigid structure, flexible plastics substrates, on which the successive layers are deposited, are used. The insulating layer is generally deposited from the liquid phase by a spin-coating or auto-assembly technique (as is the semiconductor), whereas the source, drain and gate contacts are generally formed by thermal evaporation of metals or, according to the most recent techniques, by screen-printing or soft lithography with materials of an organic nature and in the liquid phase.

Applications of flexible organic thin-film transistors relate, for example, to the development of so-called "electronic paper", which is a product that consists of a biplanar structure in which a special electric-field sensitive ink, for example, containing electrically charged microspheres, is inserted between two sheets. The application of a predetermined voltage between the two sheets (each of which has a matrix of electrodes, and at least one of which is transparent), or an absence of voltage, leads to the appearance of the ink (dark) or of the background (light) on the transparent "reading" side. For example, in the form with ink microspheres, the variation of the voltage applied between the matrices of electrodes causes the microspheres to migrate from one side of the sheet to the other.

The entire surface is arranged in pixels which can be addressed separately and text or graphic compositions preselected by the user appear, according to the voltages applied. Whatever technique is used with regard to the ink, each pixel requires an electronic driver circuitry which must also be formed on a flexible substrate.

A field-effect transistor which is disposed on a substrate with properties of flexibility and is manufactured on the basis of an insulating polyester film with polymer materials by printing techniques is described in the article "All-Polymer Field-Effect Transistor Realized by Printing Techniques" by F. Garnier, R. Hajlaoui, A Yassar and P. Srivastava which appeared in the journal "Science", Vol. 265 of 16 Sep. 1994.

U.S. Pat. No. 6,326,640 describes an organic thin-film transistor according to various configurations in which greater mobility of the charge carriers is achieved by the provision of a layer of alignment of the molecules of the organic semiconductor between the source and drain contacts. However, no techniques other than those normally adopted are indicated for the manufacture of the device in the top-contact and bottom-contact configurations.

Various disadvantages can be pointed out with regard to the known forms mentioned above.

The structure of FIG. 1c has the disadvantage that, by depositing the organic semiconductor in a non-targeted manner (for example, by spin-coating) it is deposited on the entire free surface, well beyond the channel region in which it is required, creating undesired conductive paths between source and gate or between drain and gate. To prevent this problem, in known manufacturing processes, a further technological step is performed and consists in masking of the channel region and/or in subsequent cleaning of excess organic semiconductor.

The structures of FIGS. 1a and 1b intrinsically solve the problem of the deposition of the insulation on a circumscribed area of the substrate, leaving the gate region exposed, but present problems in the alignment of the masks, which constitute an obstacle to the miniaturization of the devices.

SUMMARY OF THE INVENTION

The object of the present invention is to provide a method of manufacturing a flexible field-effect device which is simple and inexpensive and suitable for any type of final application.

The invention has also the object of providing a method of manufacture which can achieve perfect alignment between the metal contacts of the device as well as reducing parasitic capacitances.

A further object of the invention is to provide a planar-technology method of manufacture which can also be used for the production of complex, multi-layer structures that are extended vertically.

According to the present invention, these objects are achieved by means of a method having the characteristics defined in Claim 1 and a method according to Claim 15.

A further subject of the invention is an organic thin-film field-effect transistor according to Claim 16, as well as electronic paper according to Claim 19, a fabric article according to Claim 20, a sensor device for detecting chemical species according to Claim 21, and a deformation sensor device according to Claim 22.

In summary, the present invention is based on the principle of freeing the mechanical characteristics of the structure of the device from those of the substrate, which has no function per se other than that of mechanical support.

The principal innovative characteristic of the technology used consists in the production of a complete structure of a field-effect device without the use of a substrate, in which the source and drain contacts and the gate contact are on opposite sides of the insulating layer which gives the device flexibility and mechanical support, and in the use of a method for the manufacture of the device which uses a single mask to achieve perfect alignment between the source, drain and gate contacts of the device.

In contrast with the known technique, in which the insulation is normally in solution and is deposited on the substrate by spin-coating, by virtue of the selection of a film of flexible and transparent insulating material for the insulating layer of the device, with a thickness of a few tenths of a micron which is sufficient to ensure the mechanical support of the device, there is no longer any need for the substrate and a structure is produced which is assembled on the basis of the insulating intermediate layer.

By virtue of its optical transparency characteristic, the transparent insulating layer also permits automatic alignment of the metal contacts.

The independent device can thus be applied to a substrate at a stage following manufacture and assembly and, from the point of view of industrial distribution, the device can be sold alone, leaving the final user to select the substrate to which it is to be applied (for example, fabric, paper, rigid three-dimensional surfaces).

BRIEF DESCRIPTION OF THE DRAWINGS

Further characteristics and advantages of the invention will be explained in greater detail in the following detailed description of an embodiment thereof, which is given by way of non-limiting example with reference to the appended drawings, in which:

FIGS. 3a-3l show, in succession, the steps of the method for the production of the device of FIG. 2.

DETAILED DESCRIPTION OF THE INVENTION

In FIGS. 2 and 3a-3l, elements identical or functionally equivalent to those shown in FIGS. 1a-1c are indicated by the same references as were used in the description of those drawings.

An example of a structure of a field-effect transistor FET according to the invention is shown in FIG. 2. A flexible and transparent insulating film INS is used as the mechanical support of the device. The source and drain electrodes S and D are disposed on an upper face of the film and are separated by a distance equal to the desired channel length, whereas the gate electrode G is disposed on the lower face, for the entire length of the channel region. An organic semiconductor SC (for example, the polymer $OC_1C_{10}$-PPV or the pentacene oligomer) is deposited on the source and drain electrodes and on the insulator in the channel region between the electrodes, in a bottom-contact configuration.

The currently preferred insulating material is Mylar® (trade name of a Dupont polyethylene terephthalate, PET, film) the dielectric constant of which is 3.3 at 50 Hz and 3.0 at 1 MHz. Amongst all of the types of Mylar that are currently on the market, the one which is used is in the form of a very strong film 0.9 microns thick with low dielectric losses, high breakdown voltage, and high resistivity. The film is also resistant to attack by many chemical reagents.

The drain current of the device is proportional to the capacitance per unit area of the insulator which in turn is inversely proportional to the thickness of the layer. It is therefore clear that the thicker the Mylar film is the worse the performance of the device will be with low drain currents. Currently, the selected Mylar film represents the best compromise between thickness, mechanical strength, and dielectric constant.

The method for the production of the device, which preferably takes place in a clean room, is described with reference to FIGS. 3a-3l which show examples of cross-sections through an organic thin-film transistor (OTFT) in the various steps of its manufacture.

The insulating film INS is the starting layer on which the other components are deposited and is mounted on a frame F in order to be well stretched (FIG. 3a) so as to render its surface as wrinkle-free as possible.

Figure 3A:
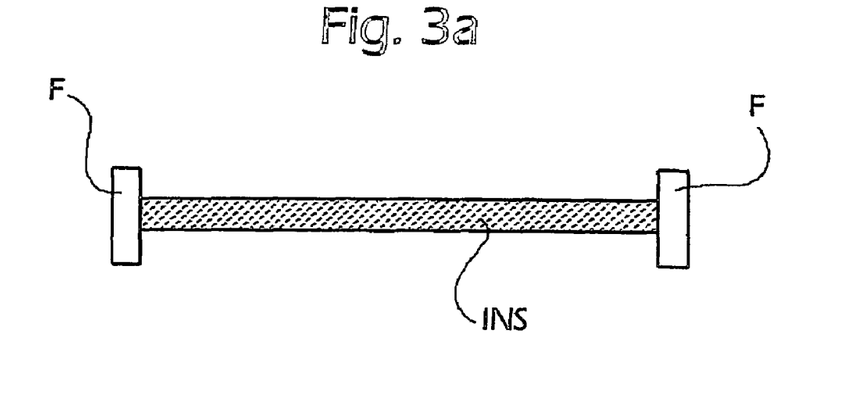

Once the film has been mounted on the frame, its free surfaces which are to receive the electrode metallizations are cleaned, for example, by immersion in acetone.

The source and drain electrodes S, D are then created on a first surface of the insulating film (the upper surface in the drawings), for example, by thermal evaporation of the metal and physical vapour deposition. This step can be performed in two alternative ways:

a) evaporation of the metal onto an extensive area of the surface of the insulator followed by a positive lithography step, that is, selective masking of the metal by resist with a configuration corresponding to the geometry of the electrodes, b) negative lithography, that is, the transfer of a layer of resist shaped in accordance with a negative configuration relative to that of the electrodes onto the surface of the insulator, followed by evaporation of the metal and subsequent chemical removal (lift-off) of the resist underlying the metal.

In the preferred embodiment, the series of steps of point a) with photolithographic technology has been selected.

Figure 3B:
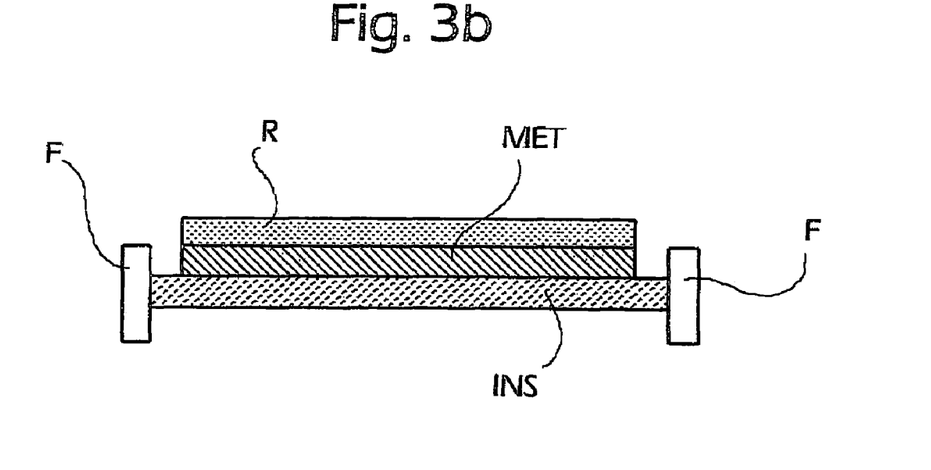

After the deposition of the metallization MET, a positive photoresist R is deposited by a spin-coating technique and is dried in a manner such as to evaporate the solvent and improve adhesion to the surface of the film (FIG. 3b).

Figure 3C:
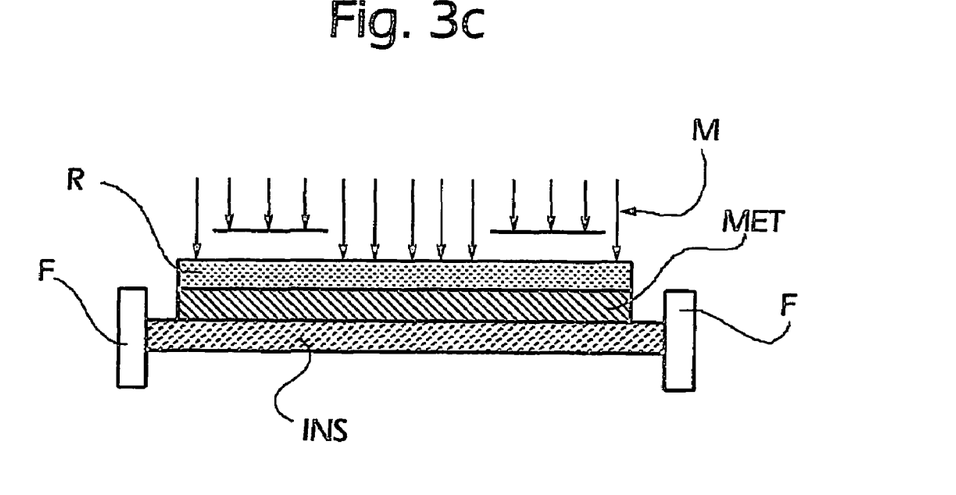
Figure 3D:
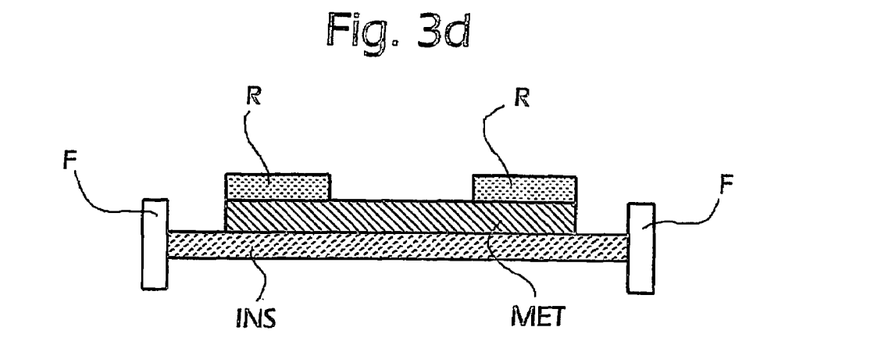

When the mask M has been positioned, the photoresist is exposed in order to transpose the preconfigured geometry of the electrodes onto it (FIG. 3c). The development of the photoresist for the removal of the exposed portions takes place in development solution (normally an NaOH solution) and is followed by a rinsing step.

Figure 3E:
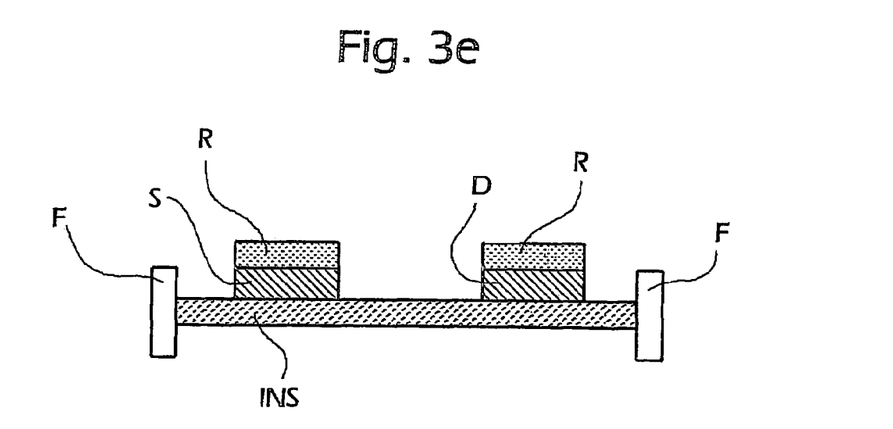

The pattern of the mask M is thus transferred onto the metallization area MET which covers the insulating film (FIG. 3d) and, outside the regions covered by the photoresist, the metal is exposed to chemical etching for its removal (FIG. 3e).

Finally, the remaining photoresist R is removed by immersion in solvent (normally acetone).

In order to create the gate electrode G on the side of the surface of the film opposite to that carrying the source and drain electrodes, a further photolithographic step is performed, utilizing the transparency of the insulating film to align the gate region with the source and drain regions. The deposition of the gate metallization thus no longer requires a respective mask with the pattern of its geometry. This operation would not be particularly onerous per se, but would significantly increase the complexity of the process bearing in mind the problem of alignment with the masks used previously; this is more complex the smaller are the dimensions of the planar structures to be produced.

Figure 3F:
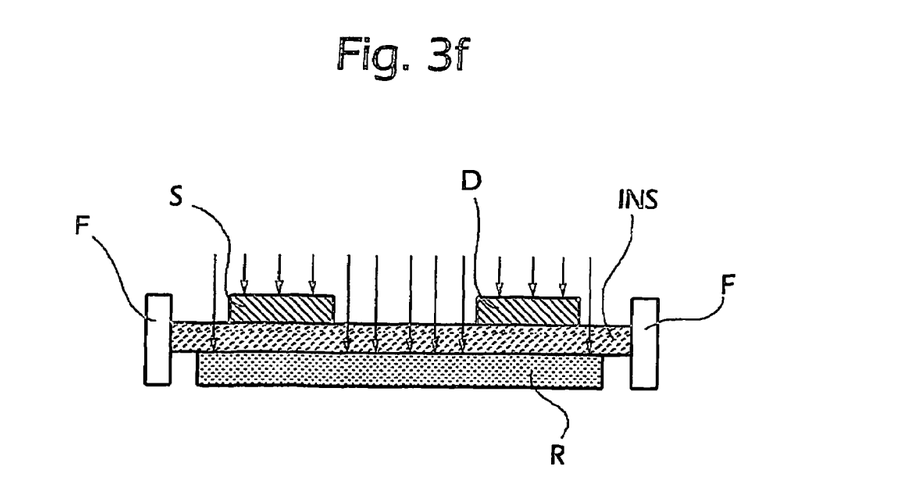
Figure 3G:
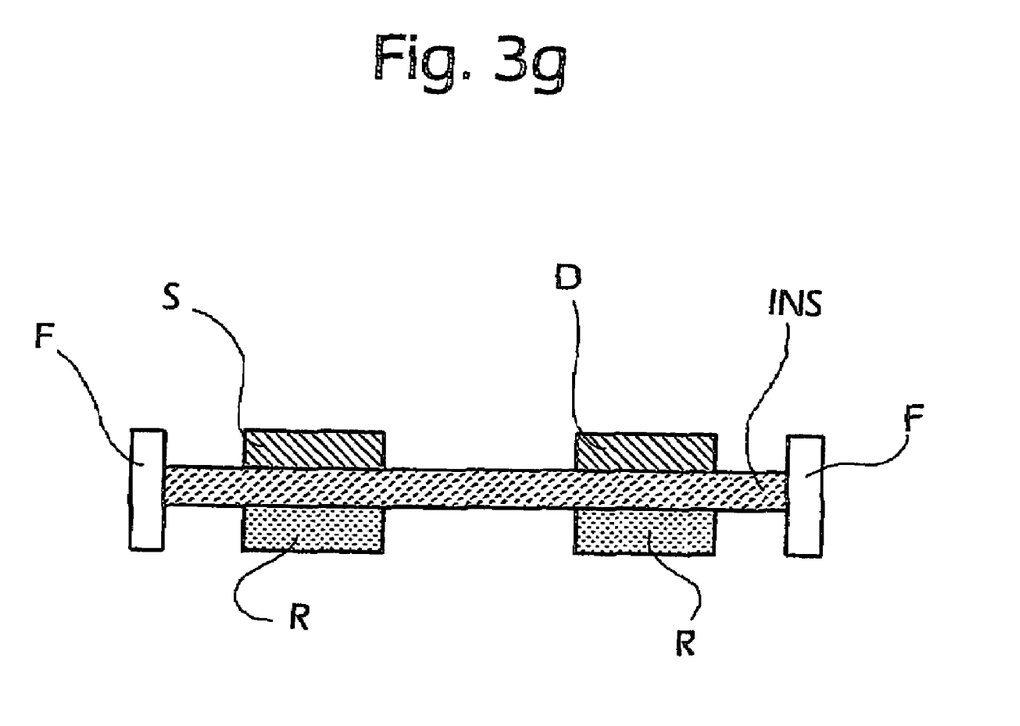
Figure 3H:
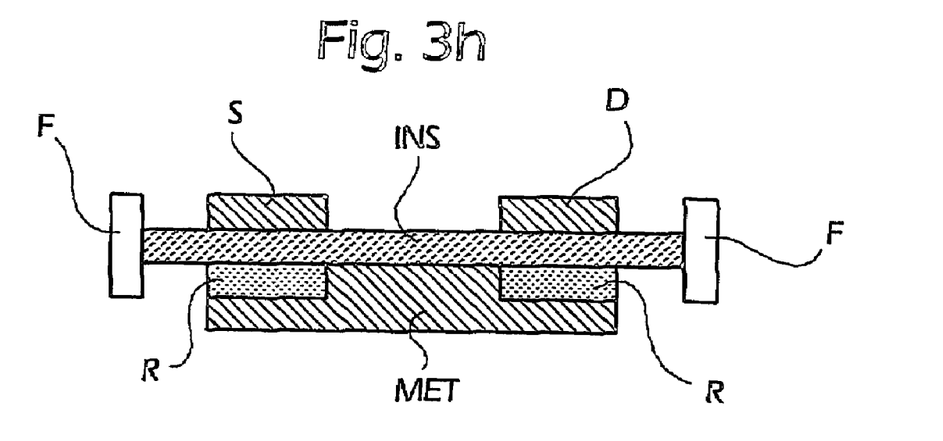
Figure 3I:
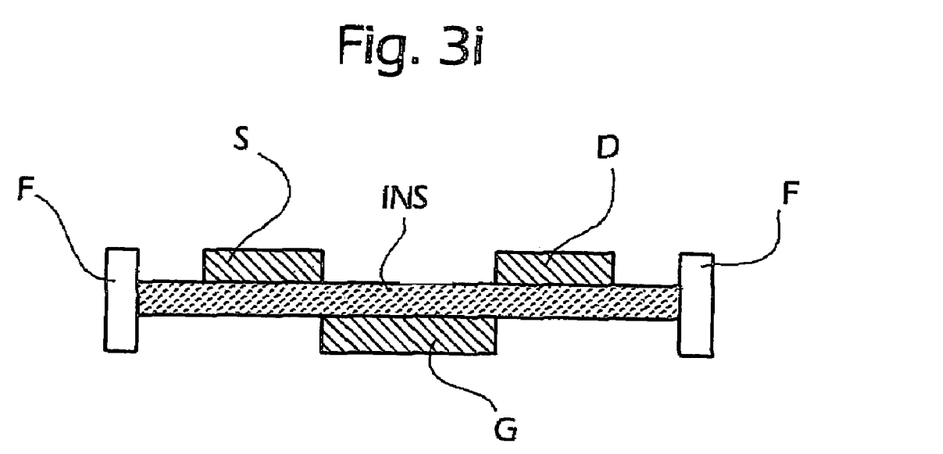

This step of the method of the invention requires the deposition of the photoresist R on the opposite surface of the insulating film to that carrying the source and drain electrodes and its subsequent exposure by illumination through the film, masked by the configuration of the source and drain electrodes already created (FIG. 3f).

The deposition of the positive photoresist on the surface of the film which is still free, by a spin-coating technique, and its drying in order to evaporate the solvent and improve its adhesion to the surface of the film can be performed at this stage or simultaneously with the deposition of the photoresist on the metallization of the first surface.

The photoresist is exposed by illumination of the structure from the side comprising the source and drain electrodes in order to transpose the geometry of those electrodes onto the photoresist in negative form. The development of the photoresist for the removal of the exposed portions (FIG. 3g) may take place after immersion in toluene or chlorobenzene solution to facilitate the subsequent lift-off of the metal; in this case also, development is achieved by immersion in a solvent (normally an NaOH solution) followed by a rinsing step.

The metallization is then performed (FIG. 3h) (for example by thermal evaporation and physical vapour deposition in the aligned regions between the source and drain electrodes. The metal (MET) is removed selectively by lift-off of the photoresist (FIG. 3i), achieving a two-dimensional arrangement precisely complementary with the configuration of the source and drain electrodes.

Figure 3L:
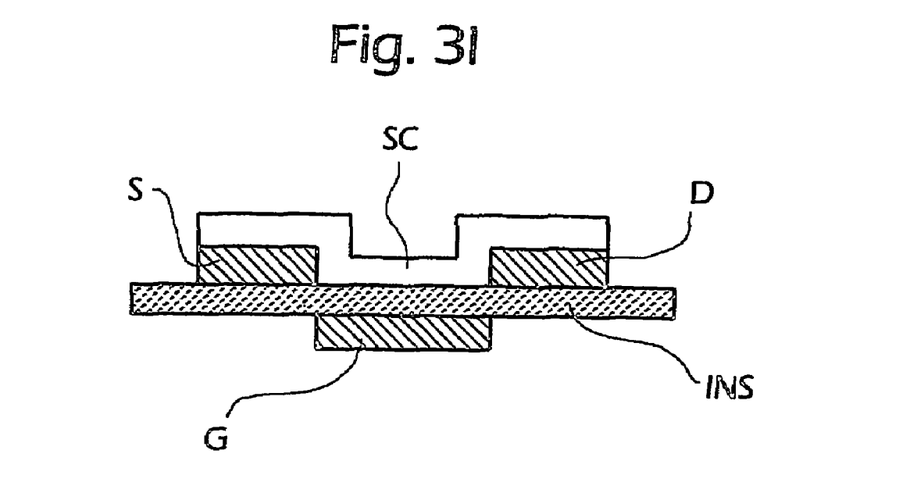

The process for the production of the device is concluded by the deposition of the organic semiconductor SC on the face comprising the source and drain electrodes (FIG. 3l).

The structure of the device of the invention is perfectly suitable for use either with a semiconductor deposited by thermal evaporation or with a semiconductor deposited by spin-coating, or by other non-targeted alternative deposition techniques (spraying, drop casting, etc.).

Figure 4:
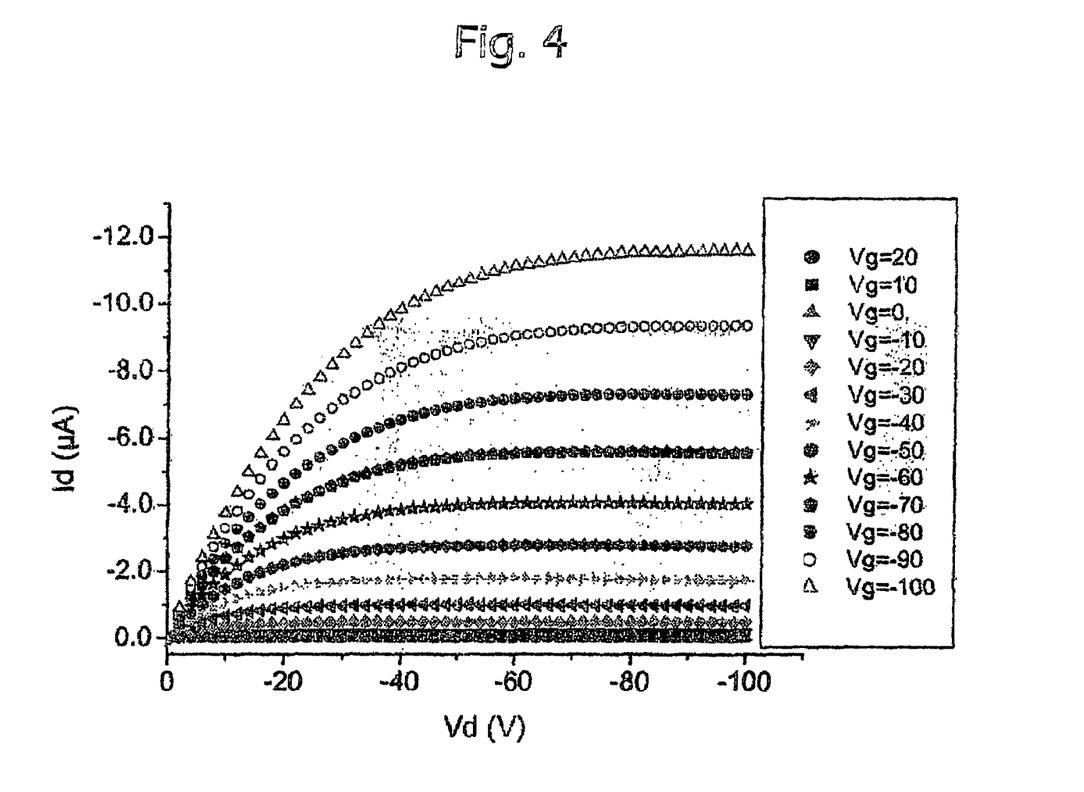
FIG. 4 shows the current-voltage characteristics of a device produced in accordance with the method of the invention.

A device thus produced has been evaluated, obtaining the characteristics of FIG. 4 in which the curves of the drain current ($I_d$) as a function of the drain voltage ($V_d$) with variations in the gate control voltage ($V_g$) are shown. These characteristics are comparable with devices of the prior art with regard to the shape of the curves, the results in terms of mobility, the $I_{on}/I_{off}$ ratio, and the threshold voltages with regard to the dependence of these parameters on the quality of the semiconductor film.

The structure which can be produced by the method of the invention has various advantages over known structures.

Since it is not formed on a particular mechanical support substrate (the thickness of which is normally a few tenths of a millimetre) it does not have constraints of rigidity due to the substrate but is completely flexible and, after the production of the device, can be applied to any substrate and, in particular, to flexible substrates such as fabrics or surfaces having three-dimensional shapes.

From a technological point of view, the structure described is easy to produce, in particular with regard to the source, drain, and gate metallization. Given the transparency of the material, only one mask (that which represents the pattern of the source and drain electrodes) is required, since the source and drain electrodes themselves then constitute a mask for the subsequent gate metallization.

Since the source and drain electrodes are deposited on the opposite side of the film to the gate electrode in accordance with the bottom-contact configuration, the device benefits from smaller contacts in comparison with the solution with horizontal geometry, and from further advantages of that configuration, without burdening the layer-deposition process with the various maskings which have been used up to now in conventional processes (top-contact and bottom-contact).

Moreover, the device thus developed enables measurements to be made in the absence of parasitic currents due to the organic semiconductor extending beyond the channel region. In currently-used structures, since the semiconductor is deposited in a non-targeted manner (for example, by a spin-coating technique), it is deposited on the entire free surface of the structure, creating undesired conductive paths between source and gate or between drain and gate and, to prevent impairment of the performance of the device, it is necessary to perform a further technological step consisting in masking of the channel region and/or in subsequent cleaning of the semiconductor deposited. In the configuration according to the invention, since the gate is separated from the drain and the source by the supporting insulating film, there is no longer any need to perform the selective deposition of the organic semiconductor.

The reproduction of this structure on insulating films thinner than 0.9 microns and/or with a dielectric constant greater than 3.0-3.3 would enable improved insulator capacitance values, and hence larger current and $I_{on}/I_{off}$ ratio values, to be obtained for a given organic semiconductor.

Improvement of the resolution of the process by optimizing the optical lithography process or providing for electronic lithography steps would enable devices of smaller dimensions to be produced with smaller channel lengths and improved dimensional ratios and would also lead to improved electronic performance.

It is foreseeable that it will be possible to reproduce the structure described with a different technology for the production of the source and drain contacts, for example, by ink-jet printing with organic conductive liquids or with conductive inks or by soft lithography; this would enable savings to be made in terms of production costs and simplicity.

The method of the invention and the configuration thus achieved advantageously enable multi-layer devices to be produced.

In silicon microtechnology, the current level of complexity of the circuits has been reached by virtue of the fact that it is possible to produce structures with several metallization layers separated by insulating layers and possibly connected by vertical contacts. These complex structures can be produced by means of successive maskings for each metallization layer, with problems of alignment of the masks which become particularly critical when the dimensions of the contacts to be produced become very small. Each insulating layer of the structure also requires a separate technological step which affects the efficiency of the method as a whole.

Up till now, this capability has not yet been taken into consideration in the field of organic devices, since the basic technology does not enable complex circuits to be produced reliably.

However, it if were found necessary to provide structures that were extended vertically, the technique of the present application would enable structures even with complex successive metallizations to be produced in the same plane (possibly on the two opposite surfaces of the film), by providing for suitable successive folding of the insulating sheet or simply superimposition of separate sheets which can easily be aligned by virtue of the transparency of the film.

A possible field of application is the development of chemical sensors of the type of silicon field-effect devices such as ISFETs and CHEMFETs. In this case, it is possible to produce sensors using the structure of the invention by providing for the functionalization of the gate electrode or of the semiconductor layer with layers of molecules which are selective with respect to particular chemical species present in the measurement environment (for example, particular types of ions in aqueous solution or in the atmosphere). The effect of the adsorption of the chemical species present in the environment is to modify, for example, the mobility of the organic semiconductor and thus to vary the electrical conductivity of the channel of the device and, more generally, to bring about a measurable change in the electrical characteristics of the device. From this point of view, it is also possible to interpose the selective molecule layer between the gate electrode and the film, the molecules being anchored chemically or physically to the insulating film. The flexibility of the final structure permits advantageous applications in the food preservation field (smart packages).

A further possible field of application is the production of pressure sensors and/or deformation sensors. The structure of the invention can in fact be subjected to deformations by pulling or bending of the insulating support film. The variation of the extent of the film brings about a change in the capacitance of the dielectric, in the length and conductivity of the channel in the organic semiconductor, and in the structure of the metallizations of the source, drain and gate contacts and this is reflected in the variation of the characteristics of the current controlled by the device. The great flexibility of the structure, within the fracture limit of the material of which the film is made, permits innumerable applications, for example, the incorporation of the sensor in seat-covering fabrics for the production of weight-sensitive motor-vehicle seats.

Naturally, the principle of the invention remaining the same, the embodiments and details of construction may be varied widely with respect to those described and illustrated purely by way of non-limiting example, without thereby departing from the scope of protection defined by the appended claims.

The invention claimed is:

1. A method for the manufacture of a thin-film field-effect device comprising, on a mechanical support layer, source and drain electrodes (S, D) suitable for operating as the source and collector of a flow of charge carriers within the device, and a layer of semiconductor material (SC) disposed between the electrodes (S, D) for the formation of a conduction channel the resistance of which is modulated by the application of a predetermined control voltage to a gate electrode (G) insulated from the channel region, characterized in that it comprises, in succession, the steps of:

providing a mechanical support layer in the form of a film (INS) of flexible, electrically-insulating material, arranging the film (INS) in an extended condition so that it has substantially smooth free surfaces, the surfaces being suitable for receiving metallizations (MET) for the formation of electrodes (S, D), forming the source and drain electrodes (S, D) in accordance with a predetermined configuration on a first surface of the insulating film, forming the gate electrode (G) in accordance with a predetermined configuration on the part of the surface of the insulating film (INS) opposite to that carrying the source and drain electrodes (S, D), and depositing the layer of semiconductor material (SC) between the source and drain electrodes (S, D);

wherein the flexible film (INS) constituting the mechanical support is transparent and the gate electrode (G) is formed by the successive steps of:

defining an electrode configuration substantially complementary with the configuration of the source and drain electrodes (S, D) on an intermediate coating layer (R), by a lithographic technique and by selective masking determined by the configuration of the source and drain electrodes (S, D) formed on the first surface of the film (INS), and selective metallization in accordance with the electrode configuration thus obtained.

2. A method according to claim 1 characterized in that the definition of the configuration of the gate electrode (G) includes the steps of:

applying an intermediate coating layer of positive resist (R) to an extensive area on the opposite surface of the film (INS) to that carrying the source and drain electrodes (S, D), exposing the resist (R) by illumination through the first surface of the film (INS) carrying the source and drain electrodes (S, D) and the transparent film (INS), developing and selectively removing the exposed resist (R), and depositing a metallization layer (MET) on an extensive area and subsequently selectively removing the metallization by removal of the residual resist.

3. A method according to claim 2, characterized in that the development of the resist (R) takes place after a bath in a toluene or chlorobenzene solution.

4. A method according to claim 2, characterized in that the source and drain electrodes (S, D) are formed from a metallization layer (MET) deposited on an extensive area of the surface of the insulating film (INS), the definition of the configuration taking place by a lithographic technique, by selective masking (M) of the metallization layer (MET) in accordance with a configuration corresponding to the geometry of the electrodes.

5. A method according to claim 4, characterized in that the step of forming the source and drain electrodes (S, D) by lithography includes, after the deposition of the metallization layer (MET), applying a positive resist intermediate coating layer (R) to the metallization layer (MET), positioning a mask (M) carrying the configuration of the electrodes, exposing the resist (R) for transposition of the configuration of the electrodes onto it, and developing the resist (R) and selectively removing the exposed areas so as to bring about transfer of the pattern of the mask (M) onto the metallization area (MET) which covers the insulating film (INS), the metallization layer (MET) outside the regions covered by the resist (R) being exposed to a subsequent chemical etching step for its selective removal.

6. A method according to claim 1, characterized in that the definition of the configuration of the source and drain electrodes (S, D) takes place by a lithographic technique by selective masking in accordance with a configuration corresponding to the geometry of the electrodes in negative form and includes the steps of:

applying a positive resist intermediate coating layer (R) to an extensive area of the surface of the film (INS), exposing the resist (R) by illumination through the mask, developing and selectively removing the exposed resist (R), and depositing a metallization layer (MET) and subsequently selectively removing the metallization by chemical removal of the residual resist.

7. A method according to claim 5, characterized in that the deposition of the resist layer (R) on the metallization layer (MET) of the first surface of the film (INS) and on the opposite surface are performed simultaneously.

8. A method according to claim 1, in which the lithographic technique is an optical lithography process.

9. A method according to claim 1, in which the lithographic technique for the formation of the source and drain electrodes is an electronic lithography process.

10. A method according to claim 1, in which the metallization layer (MET) for the formation of the source and drain electrodes is formed by ink jet printing with conductive organic liquids or with conductive inks.

11. A method according to claim 1, in which the metallization layer (MET) for the formation of the source and drain electrodes is formed by lithography.

12. A method according to claim 1, in which the flexible, transparent, electrically-insulating film (INS) is a polyethylene terephthalate film.

13. A method according to claim 12 in which the thickness of the film (INS) is less than one micron.

* * * * *